(12) United States Patent
Moshayedi et al.

(10) Patent No.: US 9,377,960 B2
(45) Date of Patent: Jun. 28, 2016

(54) SYSTEM AND METHOD OF USING STRIPES FOR RECOVERING DATA IN A FLASH STORAGE SYSTEM

(75) Inventors: Mark Moshayedi, Newport Coast, CA (US); William Calvert, Ewhurst (GB)

(73) Assignee: HGST TECHNOLOGIES SANTA ANA, INC., Santa Ana, CA (US)

( * ) Notice: Subject to any disclaimer, the term of this patent is extended or adjusted under 35 U.S.C. 154(b) by 69 days.

(21) Appl. No.: 13/532,718

(22) Filed: Jun. 25, 2012

(65) Prior Publication Data

US 2012/0324150 A1    Dec. 20, 2012

Related U.S. Application Data

(63) Continuation-in-part of application No. 12/511,989, filed on Jul. 29, 2009, now abandoned.

(51) Int. Cl.

| G06F 12/00 | (2006.01) |
|---|---|
| G06F 13/00 | (2006.01) |
| G06F 13/28 | (2006.01) |
| G06F 3/06 | (2006.01) |
| G11C 16/04 | (2006.01) |
| G11C 29/00 | (2006.01) |
| G06F 11/10 | (2006.01) |

(52) U.S. Cl.
CPC ............ *G06F 3/0617* (2013.01); *G06F 3/0619* (2013.01); *G06F 3/0638* (2013.01); *G06F 3/0679* (2013.01); *G06F 3/0689* (2013.01); *G06F 11/1044* (2013.01); *G11C 16/04* (2013.01); *G11C 29/74* (2013.01)

(58) Field of Classification Search
CPC ... G06F 11/14; G06F 11/1446; G06F 3/0689; G06F 3/0617; G06F 3/0619; G06F 3/0638; G06F 3/0679; G06F 11/1044; G11C 29/74

USPC ............... 711/103, 114, 162; 380/28; 726/26; 713/168

See application file for complete search history.

(56) References Cited

U.S. PATENT DOCUMENTS

| 5,975,738 A | * | 11/1999 | DeKoning | .......... G06F 11/2089 |
|---|---|---|---|---|
| | | | | 700/79 |
| 6,098,077 A | | 8/2000 | Sassa | |
| 6,792,565 B1 | | 9/2004 | Koyama | |
| 7,173,852 B2 | | 2/2007 | Gorobets et al. | |

(Continued)

FOREIGN PATENT DOCUMENTS

| JP | 2002108722 A | 4/2002 |
|---|---|---|
| JP | 2002117695 A | 4/2002 |

(Continued)

*Primary Examiner* — Yong Choe
*Assistant Examiner* — Shane Woolwine
(74) *Attorney, Agent, or Firm* — McDermott Will & Emery LLP

(57) ABSTRACT

A data storage method, comprising, receiving host data to be written to a plurality of flash storage devices, allocating the host data to one or more data units of a plurality of data units, allocating pad data to one or more data units of the plurality of data units that have not been filled with host data and generating redundant data in a redundant data unit based on the plurality of data units. The method further comprises steps for writing the plurality of data units and the redundant data unit to a stripe across the plurality of flash storage devices, wherein each of the plurality of data units and the redundant data unit is written in the respective flash storage devices at a common physical address.

9 Claims, 13 Drawing Sheets

(56) References Cited

U.S. PATENT DOCUMENTS

| | | |
|---|---|---|
| 7,509,544 B2 | 3/2009 | Zhang et al. |
| 7,826,263 B2 | 11/2010 | Lee et al. |
| 7,996,720 B2 | 8/2011 | Jung et al. |
| 8,041,879 B2 | 10/2011 | Erez |
| 2003/0145167 A1* | 7/2003 | Tomita .................. 711/114 |
| 2005/0086557 A1* | 4/2005 | Sato et al. .................. 714/6 |
| 2007/0283079 A1 | 12/2007 | Iwamura et al. |
| 2009/0307414 A1 | 12/2009 | Sukegawa et al. |
| 2010/0005229 A1 | 1/2010 | Hsiao |
| 2010/0017650 A1 | 1/2010 | Chin et al. |
| 2010/0042773 A1 | 2/2010 | Yeh |
| 2010/0274773 A1* | 10/2010 | Pawar et al. .................. 707/693 |
| 2010/0287433 A1 | 11/2010 | Mu |
| 2011/0191653 A1* | 8/2011 | Zeng et al. .................. 714/763 |
| 2012/0151118 A1* | 6/2012 | Flynn et al. .................. 711/6 |
| 2012/0221888 A1* | 8/2012 | Frost et al. .................. 714/6.3 |

FOREIGN PATENT DOCUMENTS

| | | |
|---|---|---|
| JP | 2003140982 A | 5/2003 |
| JP | 2005018652 A | 1/2005 |
| JP | 2008033801 A | 2/2008 |
| JP | 2009093528 A | 4/2009 |

\* cited by examiner

SYSTEM AND METHOD OF USING STRIPES FOR RECOVERING DATA IN A FLASH STORAGE SYSTEM

This application is a continuation-in-part of U.S. patent application Ser. No. 12/511,989, filed on Jul. 29, 2009, and entitled "System and Method of Recovering Data in a Flash Storage System," the entirety of which is incorporated by reference herein.

BACKGROUND

The subject technology generally relates to flash storage systems, and more particularly to recovering data in a flash storage system.

Flash storage systems have become the preferred technology for many applications in recent years. The ability to store large amounts of data and to withstand harsh operating environments, together with the non-volatile nature of the storage, makes these flash storage devices appealing for many applications.

A typical flash storage system includes a number of flash storage devices and a controller. The controller writes data into storage blocks of the flash storage device and reads data from these storage blocks. Additionally, the controller performs error detection and correction of corrupt data stored in the storage blocks. For example, the controller may use an error correction code to recover data originally stored in a storage block. The data stored in a storage block is sometimes corrupt because of a physical failure of the storage block containing the data. In many flash storage systems, the controller identifies corrupt data stored in a failed storage block, recovers the data originally written into the failed storage block, and writes the recovered data into a spare storage block in the flash storage device. Although this technique has been successfully used to recover corrupt data in a failed storage block, the number of spare storage blocks in a flash storage device may become exhausted. Thus, this technique is limited by the number of spare storage blocks in the flash storage device. Moreover, the flash storage device may itself experience a physical failure which prevents the controller from recovering data in the failed flash storage device.

In light of the above, a need exists for an improved system and method of recovering data in a flash storage system. A further need exists for recovering data in a failed flash storage device of a flash storage system.

SUMMARY

In certain implementations, the subject technology relates to a data storage method, comprising, receiving host data to be written to a plurality of flash storage devices, allocating the host data to one or more data units of a plurality of data units, allocating pad data to one or more data units of the plurality of data units that have not been filled with host data and generating redundant data in a redundant data unit based on the plurality of data units. In certain aspects, the method further comprises steps for writing the plurality of data units and the redundant data unit to a stripe across the plurality of flash storage devices, wherein each of the plurality of data units and the redundant data unit is written in the respective flash storage devices at a common physical address.

In yet another implementation, the subject technology relates to a data storage method, comprising, reading a plurality of data units and a redundant data unit of a first stripe across a plurality of flash storage devices, wherein each of the plurality of data units and the redundant data unit have a first common physical address in the respective flash storage devices and recovering one of the plurality of data units in the first stripe associated with a read error. In certain aspects, the method further comprises steps for writing the plurality of data units, including the recovered data unit, and the redundant data unit to a second stripe across the plurality of flash storage devices, wherein each of the plurality of data units and the redundant data unit is written to the respective flash storage devices at a second common physical address different from the first common physical address.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF DRAWINGS

The accompanying drawings are included to provide a further understanding of subject disclosure, and are incorporated in and constitute a part of this specification. The drawings illustrate aspects of the subject technology, and together with the description, serve to explain the principles of the subject technology. In the drawings.

DESCRIPTION

In various aspects, a flash storage system generates redundant data based on data stored in flash storage devices of the flash storage system. The system controller stores the redundant data in one or more of the flash storage devices. Additionally, the flash storage system identifies data that has become unavailable in one or more of the flash storage devices, recovers the unavailable data based on the redundant data, and stores the recovered data into one or more other flash storage devices of the flash storage system.

Figure 1:
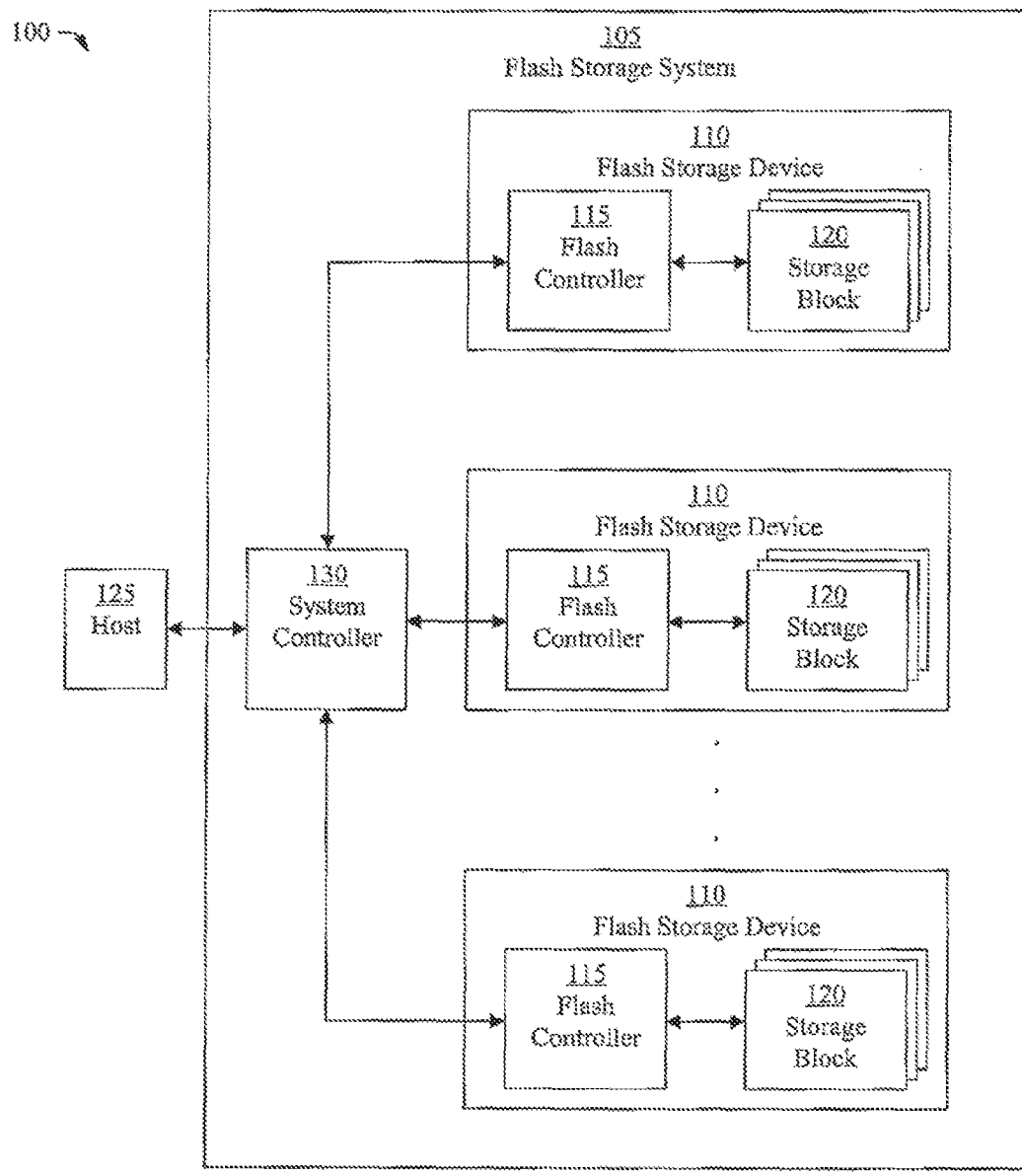
FIG. 1 is a block diagram of an example electronic system including a flash storage system, in accordance with an aspect of the subject disclosure.

FIG. 1 illustrates an electronic system 100, in accordance with an aspect of the present disclosure. The electronic system 100 includes a flash storage system 105 and a host 125 coupled to the flash storage system 105. The host 125 writes data into the flash storage system 105 and reads data from the flash storage system 105. The host 125 may be any computing or electronic device, such as a computer workstation, an embedded computing system, a network router, a portable computer, a personal digital assistant, a digital camera, a digital phone, or the like. The flash storage system 105 includes flash storage devices 110 and a system controller 130 coupled to the flash storage devices 110. Each of the flash storage devices 110 may be any type of flash storage, such as a solid-state drive, a flash memory card, a secure digital (SD) card, a universal serial bus (USB) memory device, a flash storage array, a CompactFlash card, SmartMedia, a flash storage array, or the like. The system controller 130 may include a microprocessor, a microcontroller, an embedded controller, a logic circuit, software, firmware, or any kind of processing device. Although four flash storage devices 110 are illustrated in FIG. 1, the flash storage system 105 may have more or fewer flash storage devices 110 in other aspects.

The system controller 130 writes data into the flash storage devices 110 and reads data from the flash storage devices 110. Additionally, the system controller 130 generates redundant data based on the data stored in the flash storage devices 110 for recovering data that becomes unavailable in one or more of the flash storage devices 110, as is described more fully herein. For example, data may become unavailable in one of the flash storage devices 110 if the data stored in that flash storage device 110 is unavailable, the flash storage device 110 has failed, or the flash storage device 110 is disconnected from the flash storage system 105.

Each of the flash storage devices 110 includes storage blocks 120 and a flash controller 115 coupled to the storage blocks 120. The flash controller 115 may include a microprocessor, a microcontroller, an embedded controller, a logic circuit, software, firmware, or any kind of processing device. The flash controller 115 stores data into the storage blocks 120 and reads data from the storage blocks 120. In one aspect, the flash controller 115 identifies corrupt data stored in a storage block 120, recovers the data based on the corrupted data, and writes the recovered data into another storage block 120 of the flash storage device 110, as is described more fully herein. For example, the flash storage device 110 may recover the data that has become corrupt by using an error correction code (ECC), such as parity bits stored in the flash storage device 110. Each of the storage blocks 120 has a data size, which determines the capacity of the storage block 120 to store data. For example, a storage block 120 may have a data size of 512 data bytes.

Figure 2:
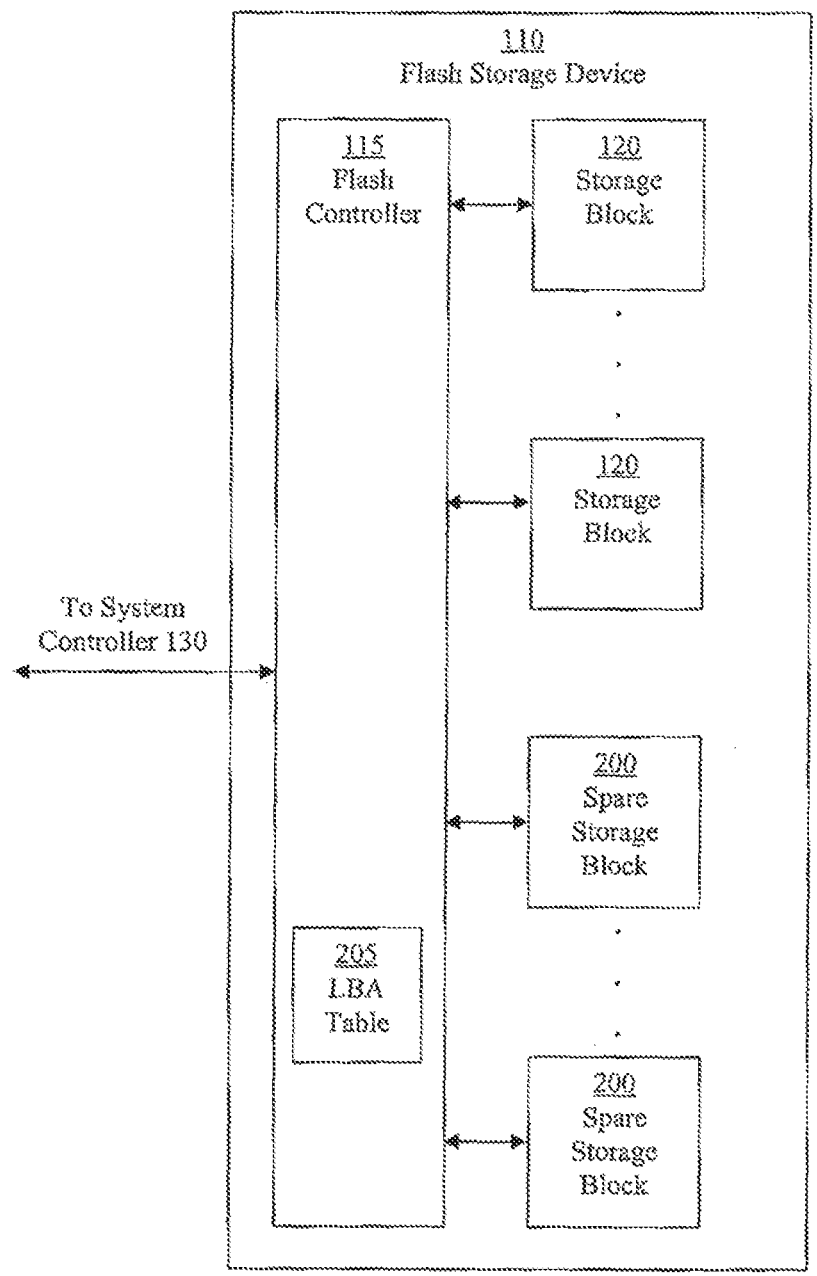
FIG. 2 is a block diagram of an example flash storage device, in accordance with an aspect of the disclosure.

FIG. 2 illustrates the flash storage device 110, in accordance with an aspect of the present disclosure. In addition to the flash controller 115 and the storage blocks 120, the flash storage device 110 includes spare storage blocks 200 coupled to the flash storage controller 115. The flash controller 115 includes a logical block address table (LBA table) 205, which defines a storage map of the flash storage device 110. The LBA table 205 maps physical addresses of the flash storage device 110 to logical addresses of the storage blocks 120 and the spare storage blocks 200. In various aspects, the flash controller 115 initially maps the physical addresses of the flash storage device 110 to logical block addresses of the storage blocks 120. The flash controller 115 then writes data into the storage blocks 120, and reads data from the storage blocks 120, using the LBA table 205.

In some cases, original data stored in the storage blocks 120 of the flash storage device 110 may become corrupt. For example, a storage block 120 may have a physical failure which causes the original data stored into a failed storage block 120 to become corrupt. The flash controller 115 corrects the corrupt data by using an error correction code (ECC), such as parity bits. The flash controller 115 generates the ECC for data to be stored in the storage blocks 120 and writes the ECC into the storage blocks 120 along with the data. On a subsequent read of the data, the flash controller 115 detects corrupt data based on the ECC, corrects the corrupt data based on the ECC to recover the original data, and writes the corrected data into one of the spare storage blocks 200. Further, the flash controller 115 modifies the LBA table 205 so that the physical addresses of the flash storage device 110 mapped to logical addresses of the failed storage block 120 are mapped to logical addresses of the spare storage block 200. Although two storage blocks 120 and two spare storage blocks 200 are illustrated in FIG. 2, the flash storage device 110 may have more or fewer than two storage blocks 120 in other aspects. Further, the flash storage device 110 may have more or fewer than two spare storage blocks 200 in other aspects.

Figure 3:
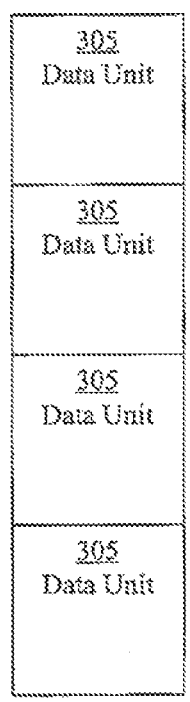
FIG. 3 is a block diagram of an example storage map for a flash storage device, in accordance with an aspect of the disclosure.

FIG. 3 illustrates a storage map 300 of a flash storage device 110, in accordance with one aspect of the present disclosure. As indicated in the storage map 300, the flash storage device 110 contains four data units 305 stored in the flash storage device 110. The data units 305 stored in the storage blocks 120 of the flash storage device 110 may be any unit of data, which determines a data size of the data unit. For example, a data unit 305 may be a data bit, a data byte, a data word, a data block, a data record, a data file, a data sector, a memory page, a logic sector, or a file sector, or any other unit of data. In some aspects, the data units 305 have the same data size as the data size of a storage block 120. In other aspects, the data units 305 may have a data size that is larger or smaller than the data size of a storage block 120. Thus, in some aspects, a storage block 120 may store more than one data unit 305 or may store one or more portions of a data unit 305. Although four data units 305 are illustrated in FIG. 3, the flash storage device 110 may store more or fewer data units 305 in other aspects.

Figure 4:
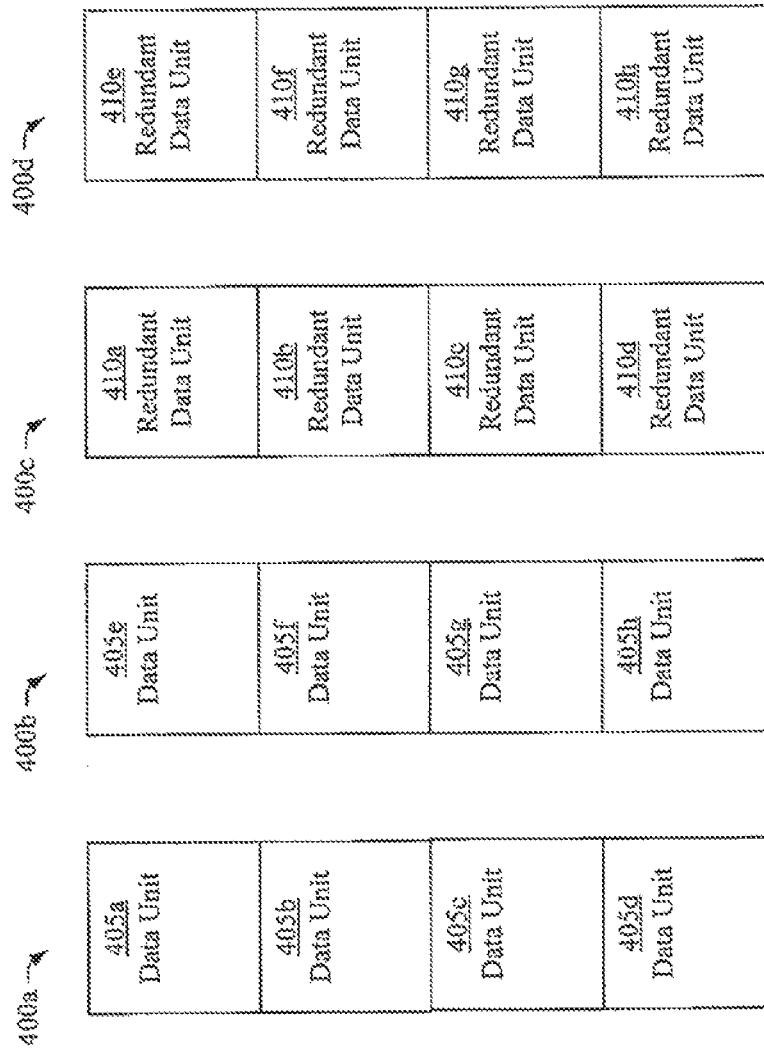
FIG. 4 is a block diagram of an example storage map for flash storage devices, in accordance with an aspect of the disclosure.

FIG. 4 illustrates storage maps 400 (e.g., storage maps 400a-d) for the flash storage devices 110 of the flash storage system 105, in accordance with an aspect of the present disclosure. The storage maps 400 correspond to the flash storage devices 110 in the flash storage system 105. As indicated in the storage maps 400, some of the flash storage devices 110 contain data units 405 (e.g., data units 405a-h) and other flash storage devices 110 contain redundant data units 410 (e.g., redundant data units 410a-h). The system controller 130 generates the redundant data units 410 based on the data units 405 by mirroring the data units 405. In this process, the system controller 130 generates the redundant data units 410 by copying the data units 405 stored in some of the flash storage devices 110 and writing the redundant data units 410 into other flash storage devices 110 of the flash storage system 105. Thus, the redundant data units 410 are copies corresponding to the data units 405 stored in the flash storage devices 110 of the flash storage system 105. As illustrated, the redundant data units 410a-h correspond to the data units 405a-h.

The system controller 130 monitors the flash storage devices 110 to determine whether any of the data units 405 becomes unavailable. A data unit 405 may become unavailable, for example, if the flash storage device 110 fails or is disconnected from the flash storage system 105. As another example, the data unit 405 may become unavailable if the data unit 405 is corrupt and the flash storage device 110 containing the data unit 405 is unable to correct the data unit 405 using the ECC associated with that data unit 405. If a data unit 405 is unavailable, the system controller 130 provides a signal to the host 125 indicating that the flash storage device 110 containing the data unit 405 has failed. The system controller 130 then reads the data unit 410 corresponding to the unavailable data unit 405 from the flash storage device 110 containing the redundant data unit 410. Further, the system controller 130 reads and writes the redundant data units 410 corresponding to the data units 405 in the failed flash storage device 110 until the failed flash storage device 110 is replaced in the flash storage system 105. In this way, the flash storage system 105 continues to operate substantially uninterrupted by the failure of the flash storage device 110.

When the failed flash storage device 110 is replaced in the flash storage system 105, the system controller 130 detects the replacement flash storage device 110. In one aspect, the replacement flash storage device 110 provides a signal to the system controller 130 indicating that the replacement flash storage device 110 has been connected to the flash storage system 105. For example, the replacement flash storage device 110 may include a physical latch or a mechanical relay that is activated to generate the signal when the replacement flash storage device 110 is connected to the flash storage system 105. After the system controller 130 detects the replacement flash storage device 110, the system controller 130 copies the redundant data units 410 corresponding to the data units 405 in the failed flash storage device 110 into the replacement flash storage device 110. In one aspect, the system controller 130 subsequently reads and writes the data units 405 in the replacement flash storage device 110 instead of the redundant data units 410 corresponding to the data units 405. In another aspect, these redundant data units 410 are deemed data units 405 and the data units 405 in the replacement flash storage device 110 are deemed redundant data units 410.

Figure 5:
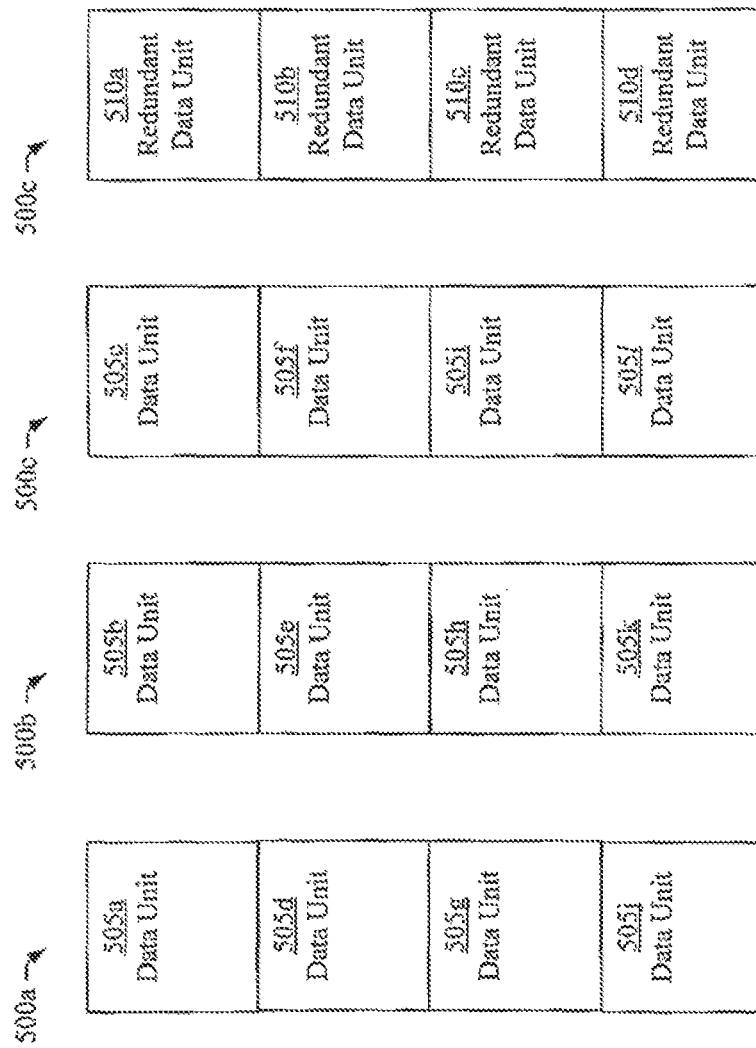
FIG. 5 is a block diagram of an example storage map for flash storage devices, in accordance with an aspect of the disclosure.

FIG. 5 illustrates storage maps 500 (e.g., storage maps 500a-d) for the flash storage devices 110 of the flash storage system 105, in accordance with another aspect of the present disclosure. The storage maps 500 correspond to the flash storage devices 110 in the flash storage system 105. As indicated in the storage maps 500, the flash storage devices 110 contain data units 505 (e.g., data units 505a-l) and redundant data units 510 (e.g., redundant data units 510a-d). The system controller 130 generates the redundant data units 510 based on the data units 505. As illustrated, the system controller 130 generates the redundant data unit 510a based on the data units 505a-c, the redundant data unit 510b based on the data units 505d-f, the redundant data unit 510c based on the data units 505g-i, and the redundant data unit 510d based on the data units 505j-l.

The redundant data units 510 are stored in one of the flash storage devices 110 dedicated to storing redundant data units 510 and the data units 505 are stored in the other flash storage devices 110. Each of the data units 505 stored in a flash storage device 110 corresponds to one of the redundant data units 510. The system controller 130 generates each redundant data unit 510 based on the data units 505 corresponding to that redundant data unit 510 and stores the redundant data unit 510 in the flash storage device 110 dedicated to redundant data units 510. For example, the system controller 130 may perform an exclusive OR (XOR) operation on the data units 505 to generate the redundant data unit 510 corresponding to those data units 505.

If a flash storage device 110 other than the flash storage device 110 dedicated to redundant data units 510 experiences a failure, the system controller 130 recovers each of data units 505 in the failed flash storage device 110 based on the corresponding data units 505 and the corresponding redundant data unit 510. If the flash storage device 110 dedicated to redundant data units 510 experiences a failure, the system controller 130 recovers each redundant data unit 510 in the failed flash storage device 110 based on the data units 505 corresponding to the redundant data unit 510. In this way, the flash storage system 105 continues to operate substantially uninterrupted by the failure of the flash storage device 110. After the failed flash storage device 110 is replaced in the flash storage system 105 with a replacement flash storage device 110, the system controller 130 recovers the data units 410 or the redundant data units 410 in the failed flash storage device 110 and writes the recovered data units 410 or the recovered redundant data units 410 into the replacement flash storage device 110.

Figure 6:
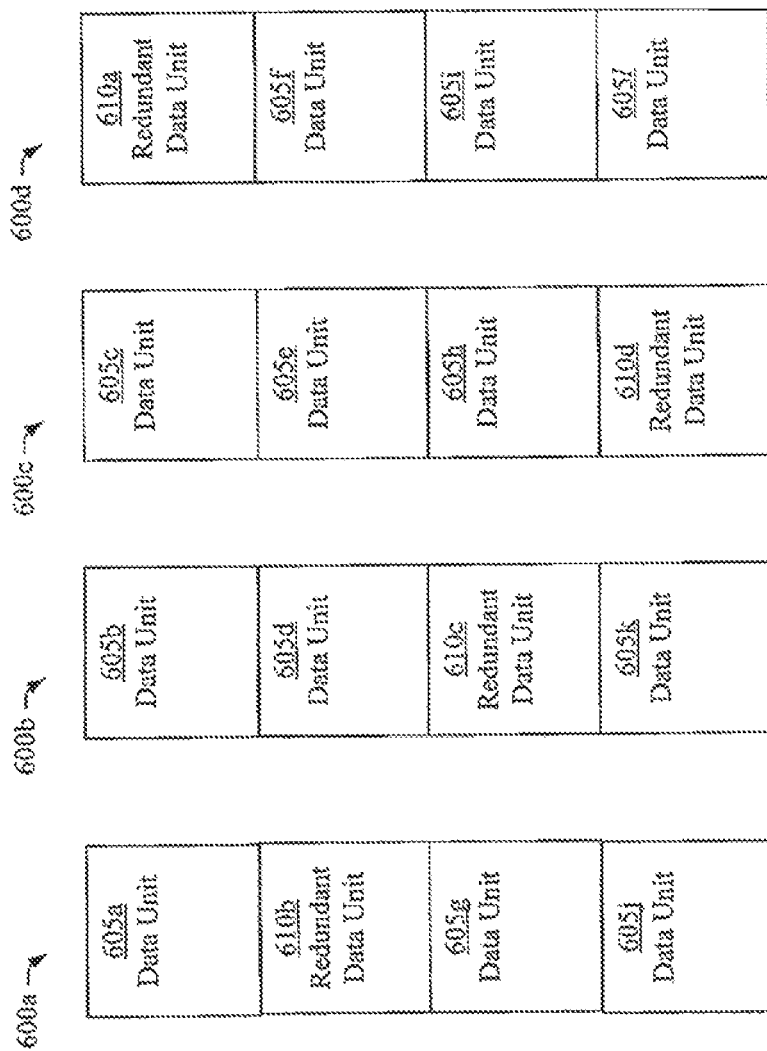
FIG. 6 is a block diagram of an example storage map for flash storage devices, in accordance with an aspect of the disclosure.

FIG. 6 illustrates storage maps 600 (e.g., storage maps 600a-d) for the flash storage devices 110 of the flash storage system 105, in accordance with another aspect of the present disclosure. The storage maps 600 correspond to the flash storage devices 110 in the flash storage system 105. As indicated in the storage maps 600, the flash storage devices 110 contain data units 605 (e.g., data units 605a-l) and redundant data units 610 (e.g., redundant data units 610a-d). The system controller 130 generates each redundant data unit 610 based on data units 605 corresponding to the redundant data unit 610. Moreover, the data units 605 and the redundant data units 610 are distributed among the flash storage devices 110. As illustrated, the system controller 130 generates the redundant data unit 610a based on the data units 605a-c, the redundant data unit 610b based on the data units 605d-f, the redundant data unit 610c based on the data units 605g-i, and the redundant data unit 610d based on the data units 605j-l. Further, the redundant data units 610a-d are stored in corresponding flash storage device 110 such that each of the flash storage devices 110 contains one of the redundant data units 610a-d.

The system controller 130 generates each of the redundant data units 610 based on the data units 605 corresponding to the redundant data unit 610 and stores the redundant data unit 610 is a flash storage device 110 that does not contain any of those data units 605. For example, the system controller 130 may perform an exclusive OR operation on the data units 605 to generate the redundant data unit 610.

As illustrated, the redundant data units 610 are striped across the flash storage devices 110. In the case of a failed flash storage device 110, the system controller 130 recovers an unavailable data unit 605 in the failed flash storage device 110 based on the data units 605 and the redundant data unit 610 corresponding to the unavailable data unit 605. Similarly, the system controller 130 recovers an unavailable redundant data unit 610 in the failed flash storage device 110 based on the data units 605 data corresponding to the unavailable redundant data unit 610. In this way, the flash storage system 105 continues to operate substantially uninterrupted by the failure of the flash storage device 110. After the failed flash storage device 110 is replaced in the flash storage system 105 with a replacement flash storage device 110, the system controller 130 recovers the data units 605 and the redundant data unit 610 stored in the failed flash storage device 110 and stores the recovered data units 605 and the redundant data unit 610 into the replacement flash storage device 110.

Figure 7:
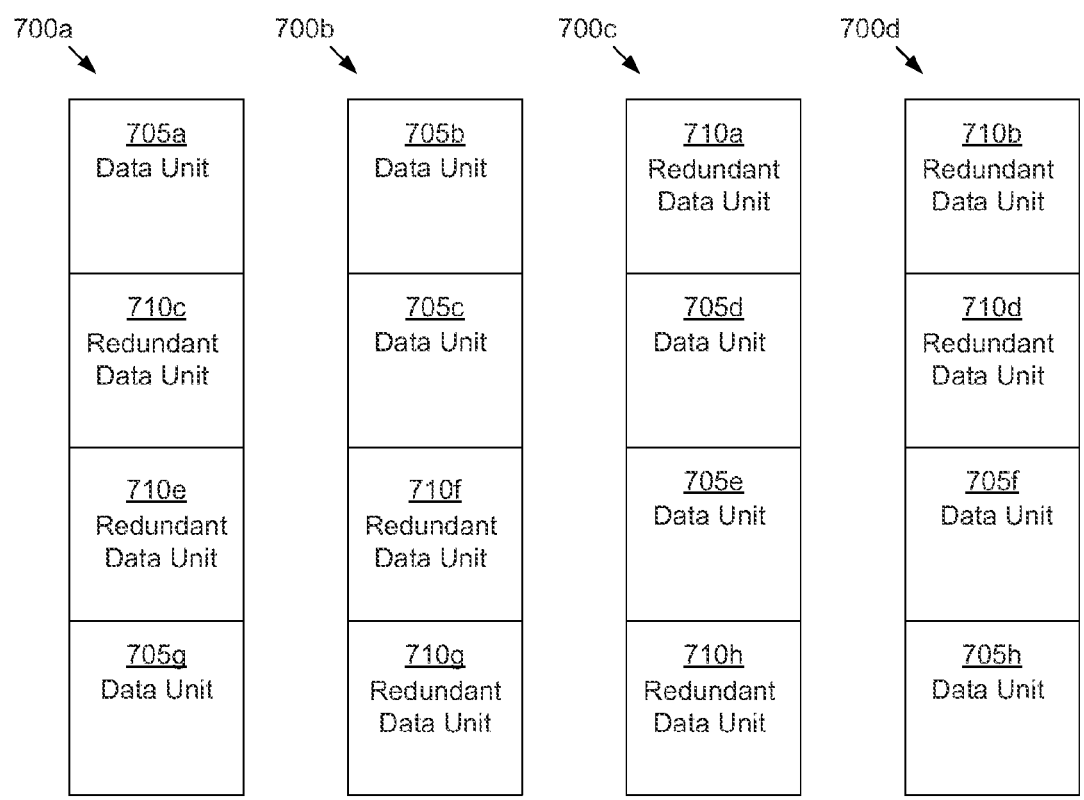
FIG. 7 is a block diagram of an example storage map for flash storage devices, in accordance with an aspect of the disclosure.

FIG. 7 illustrates storage maps 700 (e.g., storage maps 700*a-d*) for the flash storage devices 110 of the flash storage system 105, in accordance with another aspect of the present disclosure. The storage maps 700 correspond to the flash storage devices 110 in the flash storage system 105. As indicated in the storage maps 700, the flash storage devices 110 contain data units 705 (e.g., data units 705*a-h*) and redundant data units 710 (e.g., redundant data units 710*a-h*). The system controller 130 generates the redundant data units 710 based on the data units 705. The data units 705 and the redundant data units 710 are distributed among the flash storage devices 110. As illustrated, the system controller 130 generates the redundant data units 710*a* and 710*b* based on the data units 705*a* and 705*b*, the redundant data units 710*c* and 710*d* based on the data units 705*c* and 705*d*, the redundant data units 710*e* and 710*f* based on the data units 705*e* and 705*f*, and the redundant data units 710*h* and 710*h* based on the data units 705*g* and 705*h*. Further, the redundant data units 710 corresponding to data units 705 are stored in corresponding flash storage device 110 such that each of these flash storage devices 110 contains one of the redundant data units 710.

The system controller 130 generates each of the redundant data units 710 based on the data units 705 corresponding to the redundant data unit 710. In this aspect, the system controller 130 generates more than one redundant data unit 710 based on the data units corresponding to each of these redundant data units 710. For example, the system controller 130 may perform an exclusive OR operation on the data units 705 corresponding a redundant data unit 710 to generate that redundant data unit 710. Additionally, the system controller 130 may perform another operation on the data units 705 corresponding to another redundant data unit 710 to generate that redundant data unit 710.

As illustrated, the redundant data units 710 are striped across the flash storage devices 110. In the case of a failed flash storage device 110, the system controller 130 recovers an unavailable data unit 705 stored in the failed flash storage device 110 based on one or more of the data units 705 and the redundant data units 710 corresponding to the unavailable data unit, which are stored in flash storage devices 110 other than the failed flash storage device 110. Similarly, the system controller 130 recovers a redundant data unit 710 stored in the failed flash storage device 110 based on the data units 705 corresponding to the redundant data unit 710, which are stored in flash storage devices 110 other than the failed flash storage device 110. In this way, the flash storage system 105 continues to operate substantially uninterrupted by the failure of the flash storage device 110. After the failed flash storage device 110 is replaced in the flash storage system 105 with a replacement flash storage device 110, the system controller 130 recovers the data units 410 and the redundant data units 410 stored in the failed flash storage device 110 and stores the recovered data units 705 and the redundant data unit 710 into the replacement flash storage device 110.

In some aspects, the system controller 130 generates the multiple redundant data units 710 based on the data units 705 corresponding to those redundant data units 710 such that the system controller 130 recovers unavailable data units 705 in multiple failed flash storage devices 110. For example, the redundant data units 710 corresponding to data units 705 may be base on a Reed-Solomon Code as is commonly known in the art.

In various aspects, the flash storage system 105 includes one or more spare flash storage devices 110. In these aspects, the system controller 130 recovers unavailable data (e.g., data units and redundant data units) in a failed flash storage device 110 and writes the recovered data into one of the spare flash storage devices 110. Thus, the spare storage device 110 becomes a replacement flash storage device 110 for the failed flash storage device 110. Moreover, the system controller 130 recovers the unavailable data and stores the recovered data into the spare flash storage device 110 such that operation of the flash storage system 105 is uninterrupted by the failure of the flash storage device 110. The system controller 130 also provides a signal to the host 125 indicating that the flash storage device 110 has experienced the failure. The failed flash storage device 110 may then be replaced in the flash storage system 105. After the failed flash storage device 110 is replaced in the flash storage system 105, the replaced flash storage device 110 becomes a spare flash storage device 110 in the flash storage system 105. In this way, the system controller 130 recovers the data and maintains the redundant data (e.g., the redundant data units) after a flash storage device 110 experiences a failure in the flash storage system 105.

Figure 8:
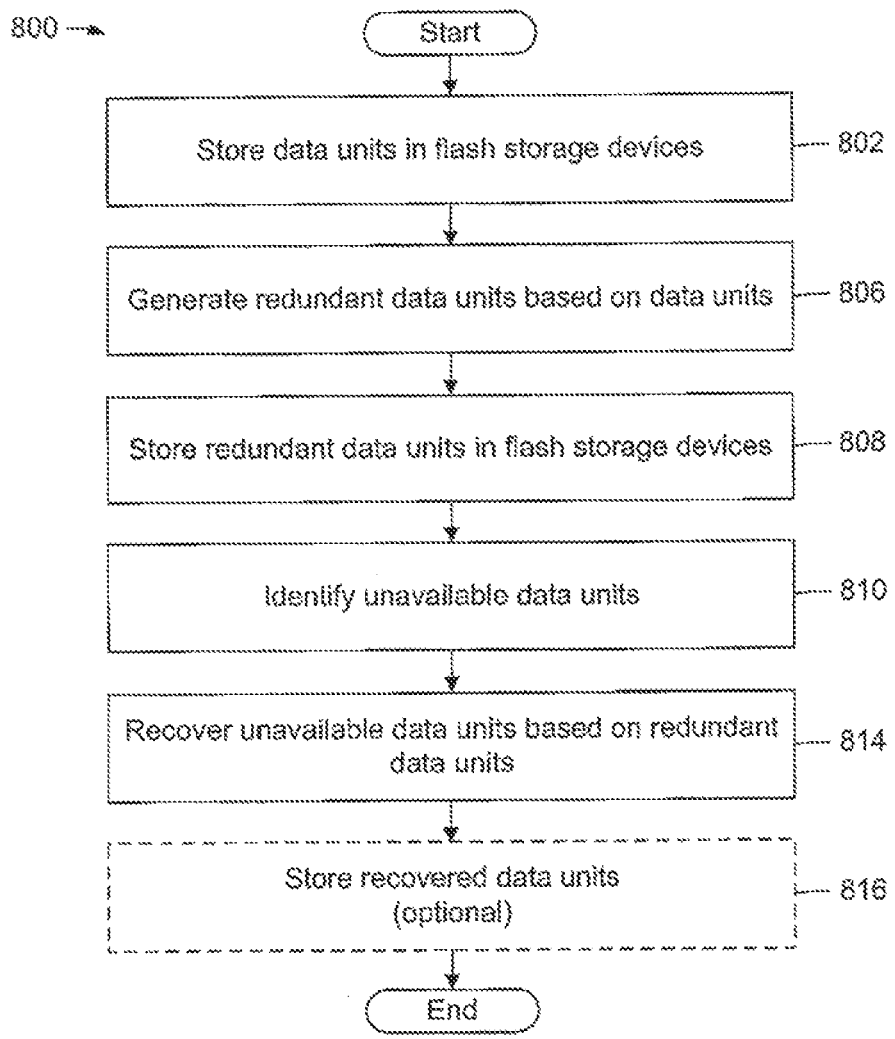
FIG. 8 is a flow chart for an example method of recovering data in a flash storage system, in accordance with an aspect of the disclosure.

FIG. 8 illustrates a method 800 of recovering data in the flash storage system 105, in accordance with an aspect of the present disclosure. In step 802, the system controller 130 of the flash storage system 105 receives data units from the host 125 and writes the data units into the flash storage devices 110. The method 800 then proceeds to step 806.

In step 806, the system controller 130 generates redundant data units based on the data units received from the host 125. In some aspects, the system controller 130 generates the redundant data units by mirroring the data units received from the host 125. In other aspects, the system controller 130 generates the redundant data units based on the data units stored in the flash storage devices 110. The method 800 then proceeds to step 808.

In step 808, the system controller 130 writes the redundant data units into the flash storage devices 110. In some aspects, the system controller 130 writes the redundant data units into one of the flash storage devices 110, which is dedicated to redundant data units. In other aspects, the system controller 130 distributes the redundant data units among the flash storage devices 110. The method 800 then proceeds to step 810.

In step 810, the system controller 130 identifies one or more unavailable data units. The unavailable data units are data units previously stored in one of the flash storage devices 110. For example, a data unit may become unavailable because of a physical failure of the flash storage device 110 storing that data unit or because the flash storage device 110 storing that data unit has been disconnected from the flash storage system 105. The method 800 then proceeds to step 814.

In step 814, the system controller 130 recovers the unavailable data units based on the redundant data units. In one aspect, the system controller 130 recovers the unavailable data units by reading the redundant data units that correspond to the unavailable data units from a flash storage device 110 other than the failed flash storage device 110. In another aspect, the system controller 130 recovers each unavailable data unit based on the redundant data corresponding to that unavailable data unit and based on one or more other data units corresponding to the unavailable data units, which are stored in one or more flash storage devices 110 other than the failed flash storage device 110. The method 800 then proceeds to step 816.

In optional step 816, the system controller 130 stores the recovered data units in a replacement flash storage device 110 in the flash storage system 105. The replacement flash storage device 110 may be a spare flash storage device 110 in the flash storage system 105 or a flash storage device 110 that has been connected to the flash storage system 105 to replace the failed flash storage device 110. The method 800 then ends. In aspects without step 816, the method 800 ends after step 816.

In various aspects, the steps of the method 800 may be performed in a different order than that described above with reference to FIG. 8. In some aspects, the method 800 may include more or fewer steps than those steps illustrated in FIG. 8. In other aspects, some or all of the steps of the method 800 may be performed in parallel with each other or substantially simultaneously with each other.

In some implementations, data received from a host is allocated among a plurality of data units and stored to the flash storage system 105, for example, in a stripe that is written at a common physical address in each of the flash storage devices. By writing the stripe to a common physical address in each of the flash storage devices, a single address can be used to reference the data units of the stripe. Thus, the data units in the stripe containing the host data can be referenced without the need to map and/or reference a unique physical address for each of the flash storage devices.

Figure 9:
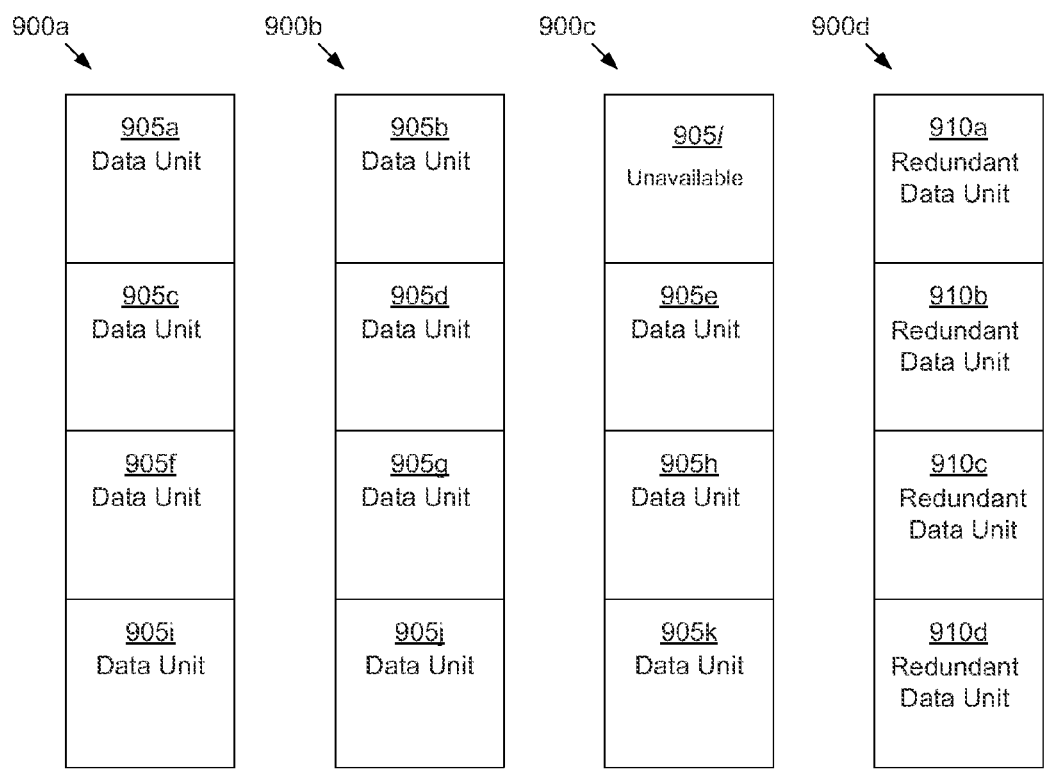
FIG. 9 is a block diagram of an example storage map for flash storage devices, in accordance with an aspect of the disclosure.

FIG. 9 illustrates an example block diagram of storage maps 900 (e.g., storage maps 900a-d) for the flash storage devices 110 of the flash storage system 105, as discussed above with respect to FIG. 1. As indicated in the storage maps 900, the flash storage devices 110 contain data units 905 (e.g., data units 905a-k), redundant data units 910 (e.g., redundant data units 910a-d) and have unavailable memory location 905l. The data units 905a-k and redundant data units 910a-d are units of data written into the flash storage devices (e.g., by the system controller 130), in available memory locations in the flash memory devices.

The system controller 130 is configured to receive host data (e.g., from the host 125) and to divide the host data among a plurality of data units. The data units are then stored in available memory locations at a common physical address in each of the flash storage devices 110. In certain aspects, the system controller is configured to write host data into one or more stripes across a plurality of available memory locations, wherein the available memory locations for each stripe will share a common physical address across the flash storage devices. Thus, the data of the stripe is accessible by mapping/referencing the common physical address with respect to each of the flash storage devices 110, rather than mapping/referencing a unique physical address for each of the flash storage devices.

By way of example, one or more stripes can be written across available memory locations (e.g., at common physical addresses) that correspond with data units 905a-c and redundant data unit 910a. Furthermore, in certain implementations, an indication of which memory locations associated with the stripe are available, or unavailable (e.g., unavailable memory location 905l), is stored to data in the stripe, for example, in a redundant data unit. As one or more available memory locations at a particular physical address become unavailable, data written to the stripe is written only in the remaining available memory locations. The amount of data (e.g., host data) that can be stored to a particular stripe will depend on the number of available memory locations corresponding with the stripe. Thus, as available memory locations for a particular stripe become unavailable, smaller amounts of data will be stored to that stripe. One advantage to avoiding the use of unavailable memory locations (rather than reassigning data to new available locations at a different physical address), is to avoid the use of memory locations that are not associated with the common physical address of the stripe. The subject technology provides a way to reference data of a stripe, using a single common physical address for each of the associated flash storage devices 110.

Figure 10:
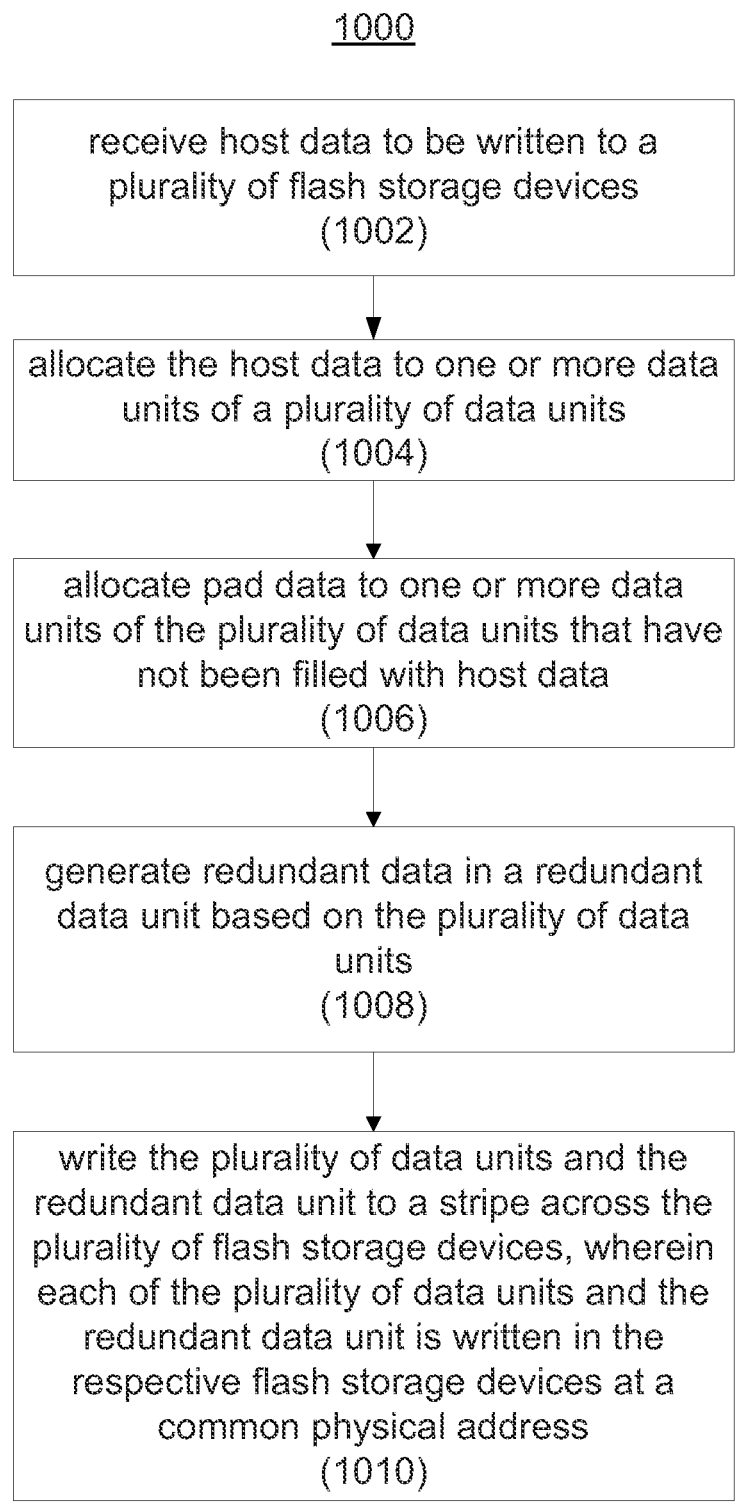
FIG. 10 illustrates steps of an example method for storing a stripe to a plurality of flash storage devices, according to certain aspects of the disclosure.

FIG. 10 illustrates steps of an example method 1000 for storing a stripe to a plurality of flash storage devices. The method 1000 begins with step 1002 in which host data to be written to a plurality of flash storage devices is received. As discussed above, the host data can be received by the system controller 130 e.g., from the host 125. In certain implementations the system controller 130 may store and access data indicating which memory locations in the flash storage devices are available and/or which memory locations are unavailable.

In step 1004, the host data is allocated to one or more data units of a plurality of data units, for example, by the system controller 130. Subsequently, in step 1006, pad data is allocated to one or more data units of the plurality of data units that have not been filled with host data. Depending on the number of data units needed to complete a stripe across the flash storage devices, pad data may be written to one or more data units that do not comprise any host data. Pad data also may be written to one or more data units that comprise host data. For example, pad data may be written to a data unit that is only partially filed with host data. In certain implementations, pad data written to data units is parity neutral with respect to a parity engine/algorithm (e.g., XOR engine) used to generate the parity data. Accordingly, the pad data has no effect on error correction processing if the pad data is included with the host data.

In step 1008, redundant data is generated in a redundant data unit based on the plurality of data units. The redundant data can include parity data, for example, that is based on the host data received from the host 125. The redundant data and/or the parity data of the redundant data unit can be used to perform error correction decoding on the host data read from the stripe, for example, to recover host data that has been written to one or more invalid (e.g., corrupted) data units.

In step 1010, the plurality of data units and the redundant data unit are written to a stripe across the plurality of flash storage devices, wherein each of the plurality of data units and the redundant data unit is written in the respective flash storage devices at a common physical address.

In some aspects, the flash storage devices may comprise an unavailable memory location at the common physical address (e.g., the unavailable memory location 905l, discussed above). In such instances, an indicator for each of the flash storage devices having an unavailable memory location at the common physical address is stored for later access. As such, the plurality of data units and the redundant data unit will not be written to the flash storage devices comprising the unavailable location at the common physical address.

Figure 11:
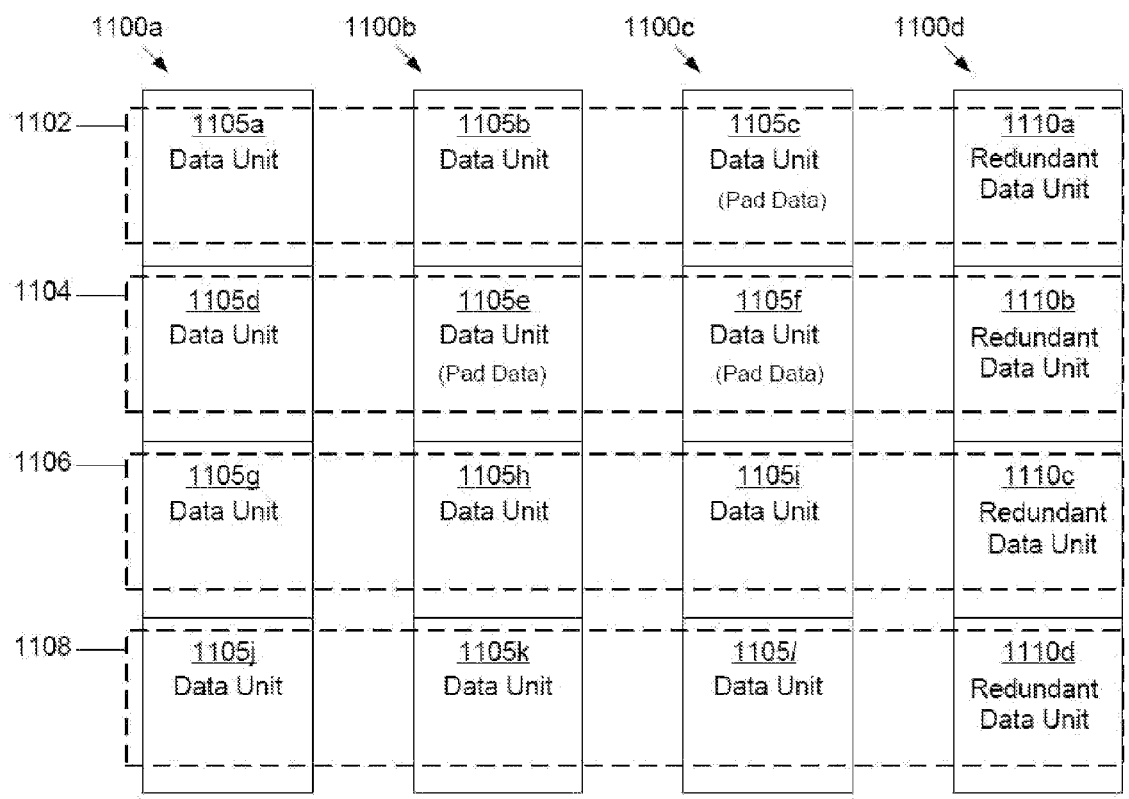
FIG. 11 is a block diagram of storage maps for flash storage devices, in accordance with an aspect of the present disclosure.

FIG. 11 is a block diagram of storage maps for flash storage devices, (e.g., storage maps 1100a-d) for the flash storage devices 110 of the flash storage system 105. Similar to the storage maps described above with respect to FIG. 9, the flash storage maps 1100a-d comprise a plurality of available memory locations for storing one or more stripes. As illustrated, stripe 1102 comprises data units 1105a-c and redundant data unit 1110a. Stripe 1104 comprises data units 1105d-1105f and redundant data unit 1110b. Stripe 1106 comprises data units 1105*g*-1105*i* and redundant data unit 1110*c*. Furthermore, stripe 1108 comprises data unit 1105*j*-1105*l* and redundant data unit 1110*d*.

In the example of FIG. 11, data units 1105*a*, 1105*b* and 1105*d*-1105*l* store host data (e.g., data received from the host 125). As indicated, data units 1105*c*, 1105*e* and 1105*f* store pad data and redundant data units 1110*a*-1110*d* store redundant data, for example, redundant data based on the host data (and pad data) of the respective stripe. For example, the redundant data unit 1110*a* stores redundant data based on the host data of data units 1105*a* and 1105*b*, as well as pad data of data unit 1105*c*.

In certain implementations, the amount of host data divided among the various data units may not be adequate to fill all available memory locations of a stripe. As such, pad data (e.g., the pad data of data unit 1105*c*) can be used to fill one or more remaining available memory locations of the stripe (e.g., the stripe 1102).

By way of example, a controller (e.g., the system controller 130) is configured to receive and buffer host data (e.g., from the host 125) and to write the host data into one or more stripes at periodic intervals. This process can be performed to move host data from a volatile buffer into non-volatile memory at pre-set time intervals, for example, to reduce the likelihood of data loss in the case of power loss. During some intervals, the amount of host data received and buffered may not be sufficient to fill the available memory locations of the stripe, for example, stripe 1102. As such, pad data is written to the available memory locations (e.g., the data unit 1105*c*) of the stripe 1102, and not filled with host data.

Pad data written to a stripe can be parity neutral, such that the pad data will not affect error correction decoding performed on host data of the stripe. Thus, when data is read out of the stripe 1102, all data units (including the redundant data unit) of the stripe 1102 can be subjected to error correction decoding, without the need to track which data units comprise host data and which comprise pad data. In implementations wherein the stripe comprises parity neutral pad data, the pad data can be read out (e.g., along with the host data and the redundant data), without affecting the error correction processing performed on the host data and the redundant data.

In some aspects, an indication of which memory locations associated with the stripe 1104 contains pad data is stored in the stripe 1104, for example, in a redundant data unit. In some aspects, pad data is written to available memory locations at the end of a host data stream (e.g., data units 1105*e* and 1105*f*) after the host data has been filled in the stripe 1104. Therefore, an indication of the start of the pad data also provides an indication that there is no host data in the remainder of the stripe. In some aspects, only the memory location indication of the first data unit containing the pad data is stored (e.g., memory location of data unit 1105*e*). In these aspects, the system controller is configured to read all data units containing the host data and the redundant data unit while ignoring the first data unit that has been identified as containing pad data (e.g., data unit 1105*e*) and all subsequent data units of stripe 1104 (e.g., data unit 1105*f*). That is, data units containing pad data 1105*e*-1105*f* will not be read, nor will they be passed through the error correction decoding process.

Figure 12:
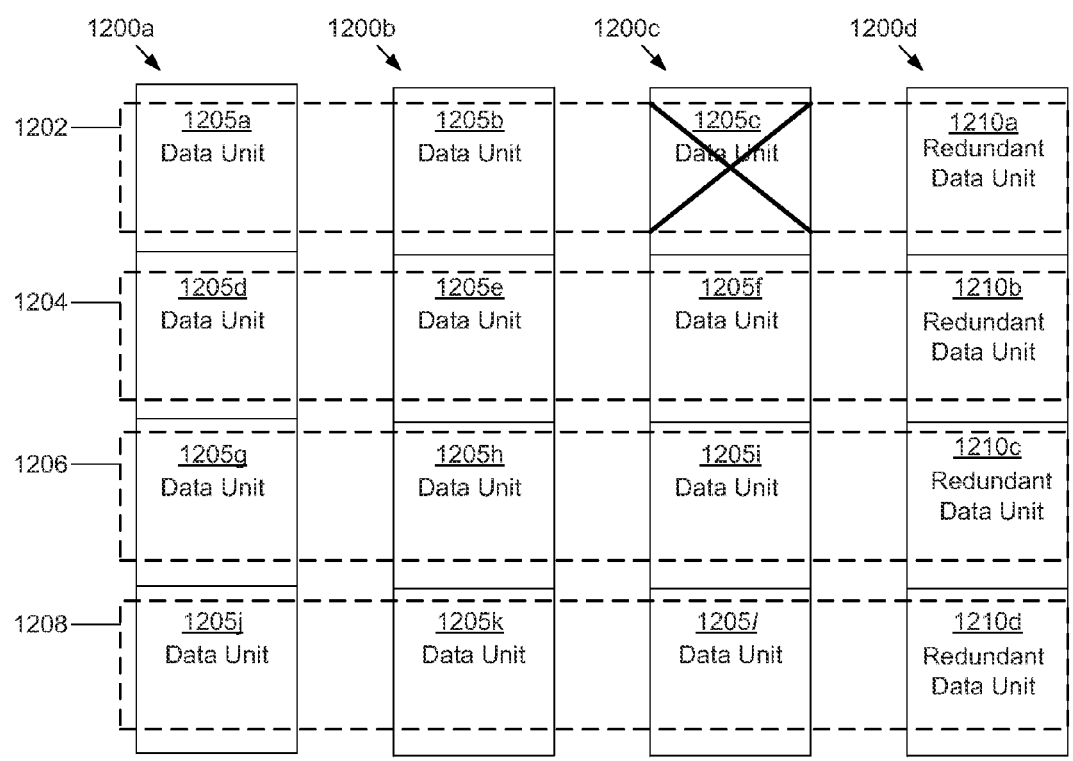
FIG. 12 is a block diagram of storage maps for flash storage devices, in accordance with an aspect of the present disclosure.

FIG. 12 is a block diagram illustrating an example of storage maps (e.g., storage maps 1200*a*-*d*) for flash storage devices 110 of the flash storage system 105, as discussed above. Similar to the storage maps discussed with respect to FIG. 11, the flash storage maps 1200*a*-*d* can comprise a plurality of available memory locations for storing one or more stripes, for example, stripes 1202, 1204, 1206 and 1208.

As illustrated in the example of FIG. 12, one of the memory locations corresponding with stripe 1202 have been identified as invalid. For example, a read error may have been generated while trying to read data unit 1205 of stripe 1202. In certain aspects, all data of stripe 1202, including the data of data unit 1205*c*, is recovered and stored to a new common physical address in the respective flash storage devices.

The host data stored in one or more data units associated with a read error can be recovered, for example, using the redundant data of the stripe. In some implementations, the redundant data of the stripe can include parity data. By way of example, host data of stripe 1202, including host data of data unit 1205*c*, is recovered using the valid data of the stripe (e.g., of data units 1205*a* and 1205*b*), together with the redundant data of redundant data unit 1210*a*. In some implementations, the host data of stripe 1202*a* is recovered using an exclusive 'OR' (XOR) operation performed on all of the corresponding data units of the stripe (e.g., data units 1205*a*-*c* and redundant data unit 1210*a*).

In certain aspects, a read error for one or more data units in a flash storage device may be indicative of an increased probability for read errors with respect to other data units in nearby memory locations in the flash storage device. By way of example, a read error for a data unit in a particular memory block may indicate an increased likelihood of a read error for other data units in the same memory block. As such, a read error for one or more data units of a stripe (e.g., stripe 1202) in a particular block can trigger the rewriting of data units associated with all stripes in that particular memory block to new common physical addresses in another memory block in the flash memory devices.

By way of example, the read error for data unit 1205*c* in stripe 1202 may indicate an increased likelihood for a read error with respect to data unit 1205*f* of stripe 1204. As such, the read error of data unit 1205*c* can trigger the rewriting of data units 1205*d*-*f* and redundant data unit 1210*b*, to a new common physical address of another memory block in the flash memory devices.

By rewriting all data units of the stripe to the new common physical address (rather than reassigning just the recovered data units to new memory locations), the data of the stripe can be referenced using a single common physical address across the flash memory devices. Furthermore, in some implementations, multiple stripes may be moved based on the failure of one or more memory locations. For example, the failure of one or more memory locations of a particular memory block can be used to trigger the movement of all stripes having data units stored in the memory block.

Figure 13:
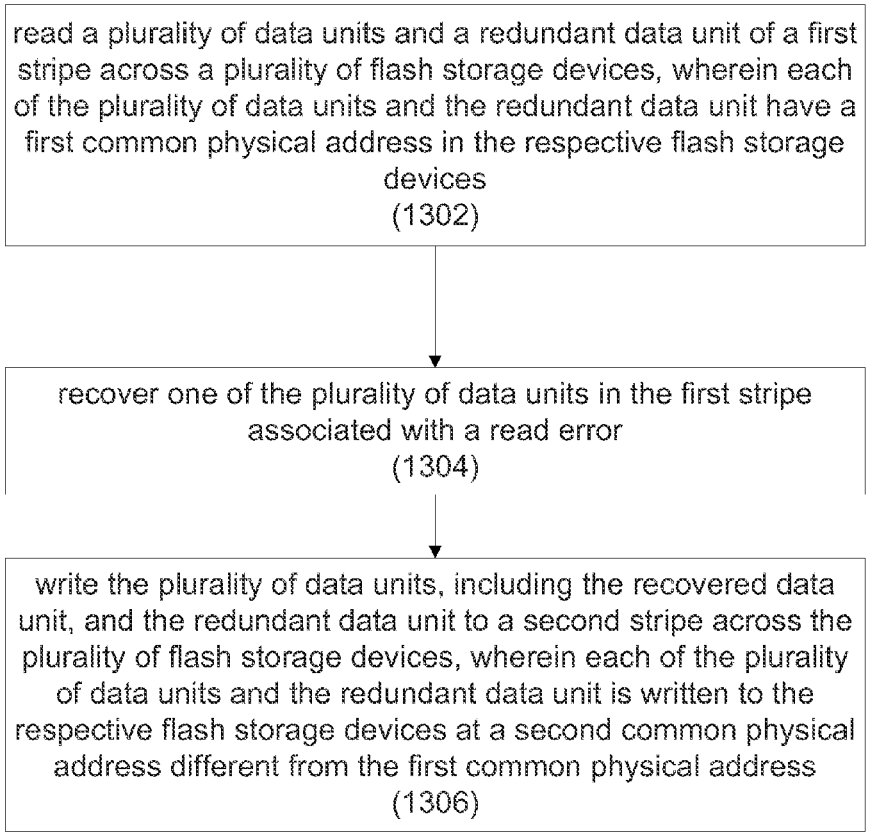
FIG. 13 illustrates steps of an example method for recovering a stripe at a first common physical address and moving the stripe to a second common physical address, according to certain aspects of the disclosure.

FIG. 13 illustrates steps of an example method 1300 for recovering host data of a first stripe at a first common physical address and moving the host data to a second common physical address. The method 1300 begins with step 1302, in which a plurality of data units and a redundant data unit of a first stripe are read across a plurality of flash storage devices. As discussed above, each of the plurality of data units and the redundant data unit have a first common physical address in the respective flash storage devices.

In step 1304, one of the plurality of data units in the first stripe associated with a read error is recovered. The host data of the first stripe can be recovered using error correction processing performed on the host data using the redundant data (e.g., redundant data including parity data) associated with the stripe, for example, that is stored in a redundant data unit. In some implementations, error correction processing can include an XOR operation performed on one or more data units (including a redundant data unit) of the first stripe.

In step 1306, the plurality of data units, including the recovered data unit and the redundant data unit are written to a second stripe across the plurality of flash storage devices, wherein each of the plurality of data units and the redundant data unit is written to the respective flash storage devices at a second common physical address that is different from the first common physical address.

As noted above, by writing the plurality of data units of the first stripe to a second stripe at a second common physical address (rather than readdressing host data of the one or more invalid memory locations), the data of the first stripe can continue to be referenced using a single common physical address (e.g., the second common physical address) in each of the respective flash storage devices.

In certain implementations, the method 1300 can further comprise steps for identifying a plurality of data units and a redundant data unit of a third stripe store across the plurality of flash storage devices, wherein each of the plurality of data units and the redundant data unit of the third stripe have a third common physical address in the respective flash storage devices. In some implementations the first common address (e.g., of the first stripe) and the third common physical address (e.g., of the third stripe) will share a common block in the respective flash memory devices. In such instances, a read error for one or more of the data units of the first stripe may be indicative of an increased likelihood for a read error of one or more data units of the third stripe (e.g., in the common block).

As such, the plurality of data units and the redundant data unit of the third stripe can be written to a fourth stripe across the plurality of flash storage devices, wherein each of the plurality of data units and the redundant data unit of the third stripe is written to the respective storage devices at a fourth common physical address different from the third common physical address.

In certain implementations, recovering a particular data unit of the first stripe can further include performing an error correction algorithm using the plurality of data units and the redundant data unit of the first stripe. For example, recovering a particular data may include performing an exclusive 'OR' (XOR) operation one or more of the plurality of data units and the redundant data unit of the stripe.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "aspect" does not imply that such an aspect is essential to the subject technology or that such aspect applies to all configurations of the subject technology. A disclosure relating to an aspect may apply to all aspects, or one or more aspects. An aspect may provide one or more examples. A phrase such as an "embodiment" may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A data storage method, comprising:
   receiving host data to be written to a stripe across a plurality of flash storage devices;
   allocating the host data to one or more data units of a plurality of data units;
   allocating pad data to one or more data units of the plurality of data units that have not been filled with host data at a periodic interval;
   generating redundant data in one or more redundant data units based on the plurality of data units at the periodic interval; and
   writing the plurality of data units and the one or more redundant data units to the stripe at the periodic interval, the one or more redundant data units storing memory locations of the pad data allocated to the plurality of data units wherein each of a respective plurality of data units and a respective one or more redundant data units is written in respective flash storage devices at a common physical address, and wherein the one or more redundant data units are distributed among the plurality of flash storage devices such that each of the one or more redundant data units is written to a different flash storage device of the plurality of flash storage devices.

2. The method of claim 1, wherein the redundant data comprises parity data.

3. The method of claim 2, wherein the pad data is parity neutral.

4. The method of claim 1, wherein one of the data units comprises host data and pad data.

5. The method of claim 1, wherein one or more portions of the plurality of flash storage devices comprises an unavailable memory location at the common physical address, and wherein the plurality of data units and the plurality of redundant data units are not written to the flash storage devices comprising the unavailable memory location at the common physical address.

6. The method of claim 5, further comprising:

storing an indicator for each of the flash storage devices having an unavailable memory location at the common physical address, wherein the indicator is stored in at least one of the one or more redundant data units.

7. A data storage method, comprising:

reading a plurality of data units and a redundant data unit of a first stripe across a plurality of flash storage devices, wherein each of the plurality of data units and the redundant data unit have a first common physical address in the respective flash storage devices;

recovering one of the plurality of data units in the first stripe associated with a read error;

writing the plurality of data units, including the recovered data unit, and the redundant data unit to a second stripe across the plurality of flash storage devices, wherein each of the plurality of data units and the redundant data unit is written to the respective flash storage devices at a second common physical address different from the first common physical address;

in response to the read error associated with the first stripe, identifying a plurality of data units and a redundant data unit of a third stripe stored across the plurality of flash storage devices, wherein the read error is not associated with the third stripe, wherein each of the plurality of data units and the redundant data unit of the third stripe have a third common physical address in the respective flash storage devices, and wherein the first common physical address and the third common physical address are located in a common block in the respective flash storage devices; and writing the plurality of data units and the redundant data unit of the third stripe to a fourth stripe across the plurality of flash storage devices, wherein each of the plurality of data units and the redundant data unit of the third stripe is written to the respective flash storage devices at a fourth common physical address different from the third common physical address.

8. The data storage method of claim 7, wherein recovering one of the plurality of data units of the first stripe further comprises performing an error correction algorithm using the plurality of data units and the redundant data unit of the first stripe.

9. The data storage method of claim 7, wherein recovering one of the plurality of data units of the first stripe comprises performing an exclusive 'OR' (XOR) operation on the plurality of data units and the redundant data unit of the first stripe.

* * * * *